US007629915B2

(12) United States Patent
Lin

(10) Patent No.: US 7,629,915 B2
(45) Date of Patent: Dec. 8, 2009

(54) HIGH RESOLUTION TIME-TO-DIGITAL CONVERTER AND METHOD THEREOF

(75) Inventor: Chia-Liang Lin, Union City, CA (US)

(73) Assignee: Realtek Semiconductor Corp., HsinChu (TW)

( * ) Notice: Subject to any disclaimer, the term of this patent is extended or adjusted under 35 U.S.C. 154(b) by 655 days.

(21) Appl. No.: 11/420,480

(22) Filed: May 26, 2006

(65) Prior Publication Data

US 2007/0273569 A1 Nov. 29, 2007

(51) Int. Cl.
*H03M 1/50* (2006.01)

(52) U.S. Cl. ...................................... 341/166; 341/164

(58) Field of Classification Search ................. 341/133, 341/155, 166, 164
See application file for complete search history.

(56) References Cited

U.S. PATENT DOCUMENTS 6,378,079 B1 * 4/2002 Mullarkey .................. 713/401
6,653,962 B2 * 11/2003 Gupta et al. ................ 341/155
7,501,973 B2 * 3/2009 Choi et al. .................. 341/166

* cited by examiner

*Primary Examiner*—Brian Young
(74) *Attorney, Agent, or Firm*—Winston Hsu

(57) ABSTRACT

A time-to-digital converter (TDC) is disclosed, the TDC comprising: a plurality of parallel circuits for receiving a common first clock and for generating a plurality of delayed clocks; a plurality of sampling circuits for receiving and sampling said delayed clocks at an edge of a second clock to generate a plurality of decisions, respectively; and a decoder for receiving said decisions and for generating a digital output accordingly.

36 Claims, 6 Drawing Sheets

HIGH RESOLUTION TIME-TO-DIGITAL CONVERTER AND METHOD THEREOF

BACKGROUND OF THE INVENTION

1. Field of the Invention

The present invention relates to a method and apparatus of time-to-digital converter (TDC), in particular to a TDC that has a very high resolution.

2. Description of Related Art

Time-to-digital converter (TDC) is well known in prior art. FIG. 1 depicts a schematic diagram of a prior art TDC 100, which comprises: a delay chain comprising a plurality of serial delay cells 110_1, 110_2, 110_3, and so on; an array of data flip-flops comprising DFF 120_1, 120_2, 120_3, and so on; and a thermometer-code decoder 130. The delay chain receives an input clock CLK and generates a plurality of delayed signals D(1), D(2), D(3), and so on. All delay cells (110_1, 110_2, 110_3, and so on) have substantially the same circuits, and therefore cause substantially the same amount of delay to their respective inputs. Let the delay caused by each of said delay cells be d. The delayed signals (i.e. D(1), D(2), D(3), and so on) from said delay cells (i.e. 110_1, 110_2, 110_3, and so on) are provided as inputs to said array of data flip-flops (i.e. 120_1, 120_2, 120_3, and so on), resulting in a plurality of decisions (i.e. Q(1), Q(2), Q(3), and so on), respectively. For instance, D(1) from delay cell 110_1 is provided to DFF 120_1, resulting in decision Q(1). All data flip-flops (i.e. 120_1, 120_2, 120_3, and so on) are triggered by a reference clock REF; it is the timing difference between the input clock CLK and the reference clock REF that we want the TDC circuit 100 to detect and digitize. Thermometer-code decoder 130 receives said decisions (i.e. Q(1), Q(2), Q(3), and so on) from said data flip-flops (i.e. 120_1, 120_2, 120_3, and so on) and converts them into a digital output TE (which stands for "timing estimate") representing a estimated timing difference between the input clock CLK and the reference clock REF.

FIG. 2 shows an exemplary timing diagram for a prior art TDC using 8 delay cells and 8 data flip-flops. In this example, the digital output TE is obtained by summing decisions from all data flip-flops, i.e. TE is equal to Q(1)+Q(2)+Q(3)+ . . . + Q(8). The estimated timing difference between the input clock CLK and the reference CLK in this diagram is thus $TE \cdot d = 4d$, where d is the amount of delay caused by each delay cell. Note that the output code group for TE in this embodiment is {0, 1, 2, . . . , 8}. In an alternative embodiment, an offset is introduced to the digital output TE so that output code group for TE is {−4, −3, −2, −1, 0, 1, 2, 3, 4}. The offset can be introduced by forcing TE=−4+Q(1)+Q(2)+Q(3)+ . . . + Q(8) and at the same time inserting four delay cells (not shown in the figure) between the reference clock CLK and the data flip flops. The offset is needed for a digital PLL (phase lock loop) application since in a steady state the timing difference (between an input clock and a reference clock) as reported by a TDC needs to be nearly zero. In an alternative embodiment using an odd number of delay cells and data flip-flops, the offset is introduced so that the code group for TE is {±1/2, ±3/2, ±5/2, . . . }. In this case, there is no "0" in the code group and ±1/2 is considered "virtually zero." For a digital PLL application, again, in a steady state the timing difference (between an input clock and a reference clock) as reported by a TDC needs to nearly true zero or virtually zero.

The timing resolution for a prior art TDC is limited by an amount of delay caused by a delay cell. For example, in modern CMOS (complementary metal-oxide semiconductor) technology, a delay cell is usually embodied by a buffer circuit, which causes a delay of no less than 20 ps. The timing resolution for a prior art TDC built in a modern CMOS circuit is therefore limited to no finer than 20 ps.

What is needed is an apparatus and method to achieve a high timing resolution despite using a circuit that causes an amount of delay no less than 20 ps.

BRIEF SUMMARY OF THIS INVENTION

In an embodiment, a time-to-digital converter (TDC) is disclosed, the TDC comprising: a plurality of parallel circuits for receiving a common first clock and for generating a plurality of delayed clocks; a plurality of sampling circuits for receiving and sampling said delayed clocks at an edge of a second clock to generate a plurality of decisions, respectively; and a decoder for receiving said decisions and for generating a digital output accordingly.

In an embodiment, a method of time-to-digital conversion is disclosed, the method comprising: receiving a common first clock and generating accordingly a plurality of delayed clocks using a plurality of parallel circuits; generating a plurality of decisions by sampling said delayed clocks at an edge of a second clock; and decoding said decisions into a digital output.

In an embodiment, a method of time-to-digital conversion is disclosed, the method comprising: receiving a common first clock; generating a first group of delayed clocks from the common first clock using a plurality of parallel circuits; generating a first group of decisions by sampling the first group of delayed clocks at an edge of a second clock; decoding the first group of decisions into a first timing estimate signal; generating a second group of delayed clocks from the common first clock using a plurality of serial circuits; generating a second group of decisions by sampling the second group of delayed clocks at an edge of a third clock derived from the second clock; decoding the second group of decisions into a second timing estimate signal; and selecting one of the first timing estimate signal and the second timing estimate signal as a final timing estimate signal.

In an embodiment, a digital phase lock loop (PLL) is disclosed, the PLL comprising: a time-to-digital converter (TDC) for receiving a first clock and a second clock and for generating a timing estimate signal indicative of a timing difference between the first clock and a second clock; a loop filter for receiving the timing estimate signal and for generating a frequency control signal; a DCO (digitally controlled oscillator) for receiving the frequency control signal and for generating an output clock; and a clock circuit for generating the second clock by either directly using the output clock as the second clock or by dividing down the output clock, wherein the TDC comprises: a plurality of parallel circuits for generating a first group of delayed clocks, a first group of sampling circuits to generate a first group of decisions from the first group of delayed clocks, and a first decoder for decoding the first group of decisions into a first tentative timing estimate signal.

In an embodiment, a method of performing high-resolution timing detection is disclosed, the method comprises: using a plurality of parallel circuits to generate a plurality of derived clocks from a common first clock, determining relative timing relationships between said derived clocks and a second clock; and determining a timing difference between the first clock and the second clock based on said relative timing relationships.

In an embodiment, a method of time-to-digital conversion is disclosed, the method comprising: receiving a first clock and generating accordingly a first group of delayed clocks using a first group of parallel circuits; generating a first group of decisions by sampling the first group of delayed clocks according to a second clock; and decoding the first group of decisions into a first tentative timing estimate; receiving the second clock and generating accordingly a second group of delayed clocks using a second group of parallel circuits; generating a second group of decisions by sampling the second group of delayed clocks according to the first clock; and decoding the second group of decisions into a second tentative timing estimate; and generating a final timing estimate according to the first tentative timing estimate and the second timing estimate.

DETAILED DESCRIPTION OF THIS INVENTION

The present invention relates to a method and apparatus for high-resolution time-to-digital converter (TDC). While the specifications described several example embodiments of the invention considered best modes of practicing the invention, it should be understood that the invention can be implemented in many way and is not limited to the particular examples described below or to the particular manner in which any features of such examples are implemented. In some instances, well-known details are not shown or described to avoid obscuring aspects of the invention.

Prior art TDC has a very limited resolution due to using a serial delay chain as a measuring stick of timing. The timing resolution achieved from using a serial delay chain is determined by an amount of delay of each delay cell. In an embodiment of TDC in accordance with the present invention, a plurality of parallel delay cells is used as a measuring stick of time; and the timing resolution is determined by a difference in amount of delay between two delay cells. Since the difference in amount of delay between two delay cells can be very small, the timing resolution can be very high.

High Resolution TDC

Figure 3A:
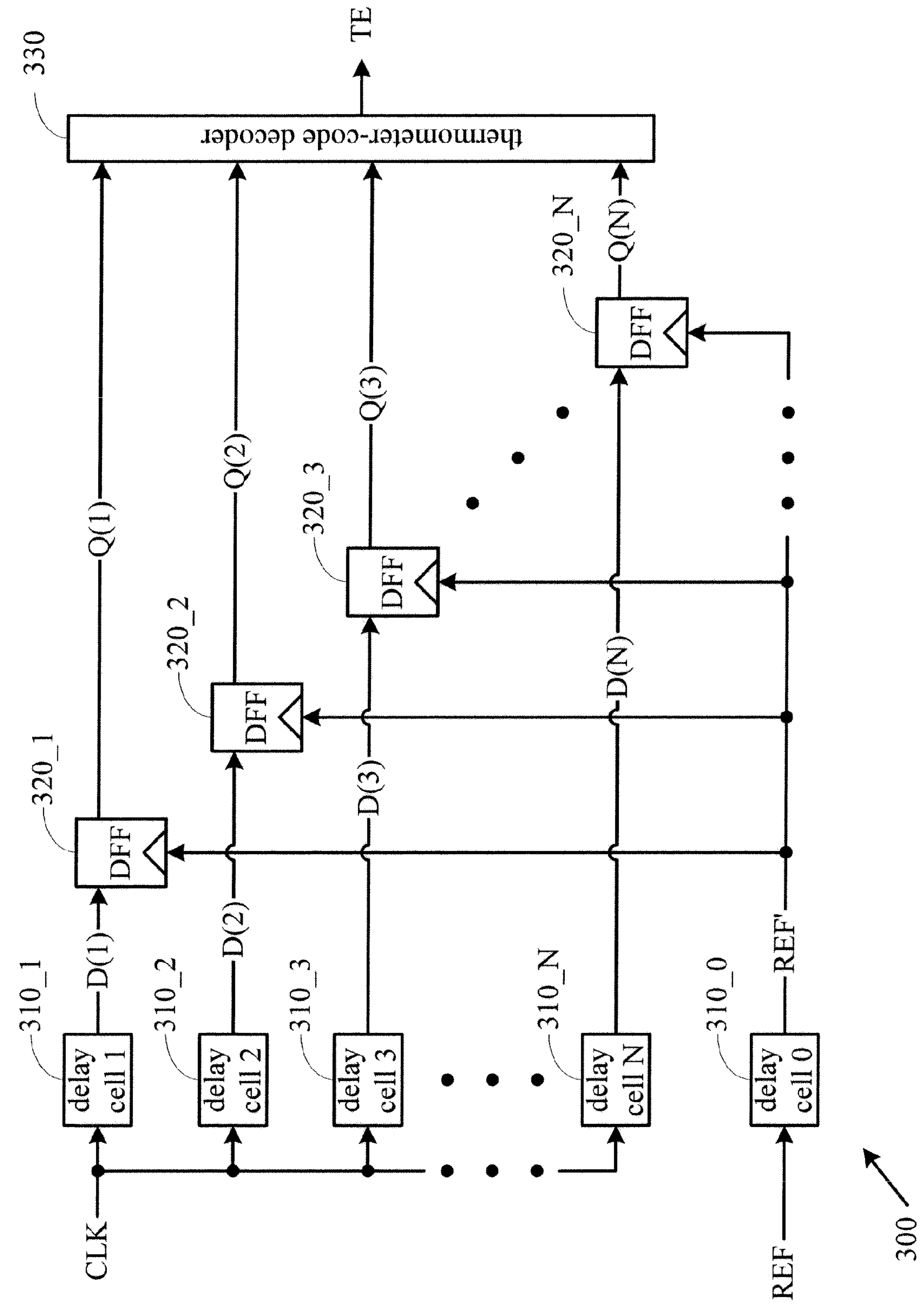
FIG. 3A depicts an embodiment of a time-to-digital converter in accordance with the present invention.

FIG. 3A depicts an exemplary embodiment of a TDC 300 in accordance with the present invention. TDC 300 comprises: a delay cell 310_0 for receiving a reference clock REF and for generating a delayed reference clock REF'; a plurality of parallel delay cells (i.e. 310_1, 310_2, 310_3, and so on) for receiving a common input clock CLK and for generating a plurality of delayed signals (i.e. D(1), D(2), D(3), and so on), respectively; a plurality of flip-flops (i.e. 320_1, 320_2, 320_3, and so on) triggered by the delayed reference clock REF', for receiving said delayed signals (i.e. D(1), D(2), D(3), and so on) and for generating a plurality of decisions (i.e. Q(1), Q(2), Q(3), and so on), respectively; and a thermometer-code decoder 330 for receiving said decisions (i.e. Q(1), Q(2), Q(3), and so on) and for generating a digital output TE indicative of an estimate of the timing difference between the input clock CLK and the reference clock REF. Delay cell 310_0 causes a delay of $d_0$ to its input REF, delay cell 310_1 causes a delay of $d_1$ to its input CLK, delay cell 310_2 causes a delay of $d_2$ to its input CLK, delay cell 310_3 causes a delay of $d_3$ to its input CLK, and so on. All these delay amounts (i.e. $d_0$, $d_1$, $d_2$, $d_3$, and so on) are different. In a preferred embodiment, all these delay amounts (i.e. $d_0$, $d_1$, $d_2$, $d_3$, and so on) form an arithmetic sequence, i.e.

$$d_n = d_0 + n\cdot\Delta, \text{ for } n=1, 2, 3, \ldots$$

where Δ is a common difference for two successive elements of the arithmetic sequence. In modern CMOS technology, the common difference Δ can be made very small, for instance as small as 1 ps, using a slight mismatch between two delay cells.

Figure 3B:
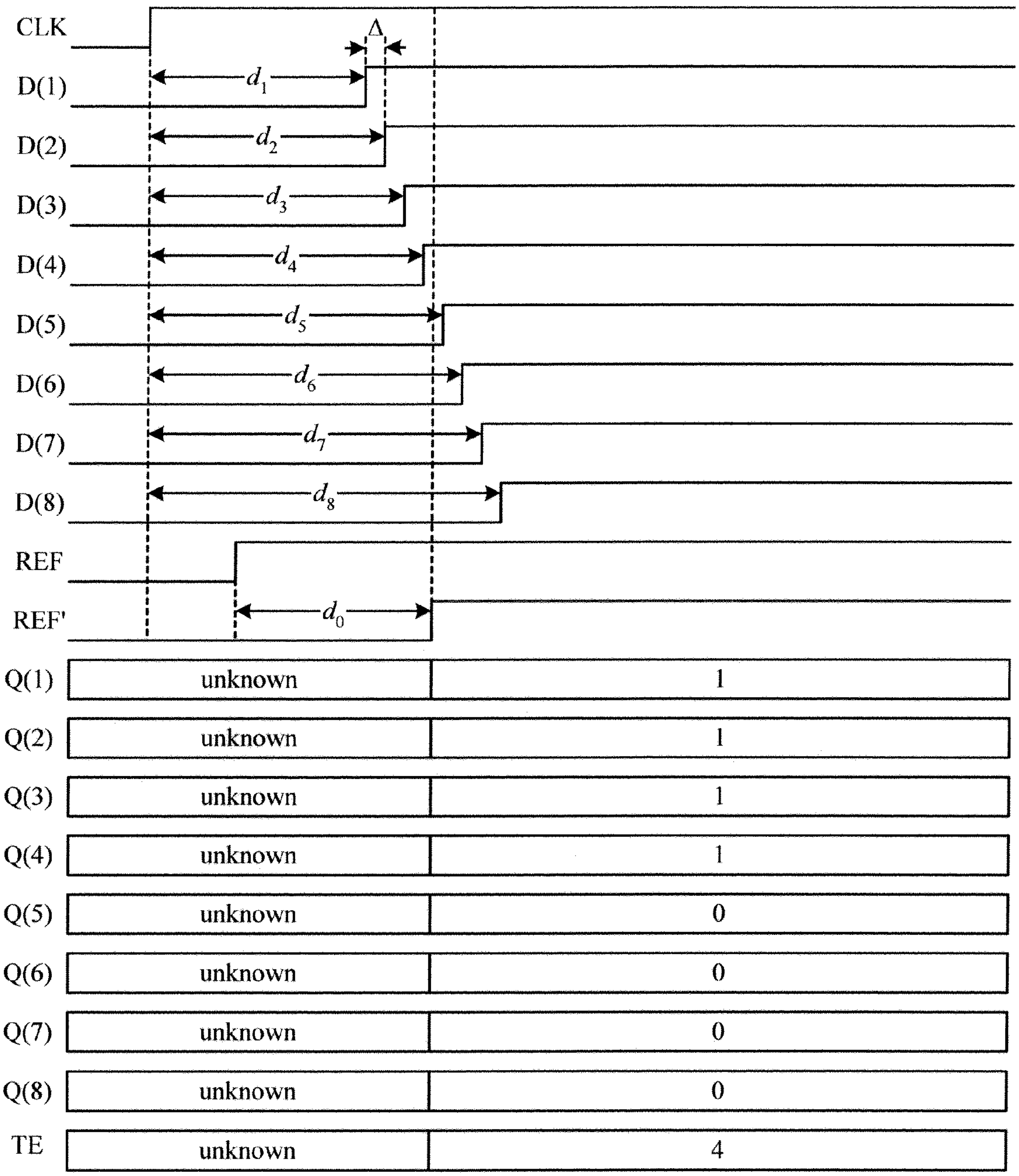
FIG. 3B depicts an exemplary timing diagram for the time-to-digital converter of FIG. 3A with 8 parallel delay cells.

FIG. 3B shows an exemplary timing diagram for TDC 300 of FIG. 3A using 8 parallel delay cells and 8 data flip-flops (i.e. N=8). In this example, the digital output TE is obtained by summing decisions from all data flip-flops, i.e. TE is equal to Q(1)+Q(2)+Q(3)+ . . . +Q(N). The estimated timing difference between the input clock CLK and the reference CLK in this example is thus TE·Δ=4Δ, where Δ is a common difference in amount of delay between two successive members of the delay cell array. It is obvious that the resolution achieved using the present invention is much higher than that in prior art. Note that the code group for the digital output TE in this embodiment is {0, 1, 2, 3, . . . , N}, and therefore TDC 300 can effectively detect the timing for the input clock CLK only when the input clock CLK is earlier than the reference clock CLK and the timing difference between the input clock CLK and the reference clock REF is between 0 and N·Δ, inclusively.

In an alternative embodiment (not shown in figure but having substantially the same circuit as TDC 300 of FIG. 3A), one chooses to use a common clock CLK' derived from the input clock CLK to sample a plurality of delayed clocks derived from the reference clock REF. That is, one uses substantially the same circuit of TDC 300 of FIG. 3A but swaps the input clock CLK with the reference clock REF. In this alternative embodiment, one can effectively detect the timing for the input clock CLK only when the reference clock REF is earlier than the input clock CLK and the timing difference between the reference clock REF and the input clock CLK is between 0 and N·Δ, inclusively.

In an alternative embodiment, an offset of N/2 (by way of example but not limitation) is introduced to the digital output TE so that the code group for TE is {−N/2, −N/2+1, −N/2+2, . . . , N/2−2, N/2−1, N/2}. The offset can be introduced by letting TE=−N/2+Q(1)+Q(2)+Q(3)+ . . . +Q(N) and at the same time changing the delay amount of delay cell 310_0 of FIG. 3A from $d_0$ to $d_0$+(N/2)·Δ. When using an odd number of parallel delay cells and data flip-flops, (i.e. N is an odd number), there is no "0" in the code group and ±1/2 is considered "virtually zero." In this alternative embodiment, one can effectively detect the timing of the input clock CLK when the timing difference between the input clock CLK and the reference clock REF is between −(N/2)·Δ and (N/2)·Δ, inclusively.

In yet another embodiment, one chooses to use a common clock CLK' derived from the input clock CLK to sample a plurality of delayed clocks derived from the reference clock REF, and at the same time introduce an offset of N/2 (by way of example but not limitation) to the digital output TE. These can be done by making the following arrangements: (1) use the same circuit of TDC 300 of FIG. 3A but swaps the input clock CLK with the reference clock REF, (2) change the delay amount of delay cell 310_0 of FIG. 3A from $d_0$ to $d_0+(N/2)\cdot\Delta$, and (3) let TE=−N/2+Q(1)+Q(2)+Q(3)+ . . . +Q(N). In this alternative embodiment, one can effectively detect the timing of the input clock CLK when the timing difference between the input clock CLK and the reference clock REF is between $-(N/2)\cdot\Delta$and $(N/2)\cdot\Delta$, inclusively.

Note that an offset of N/2 is only an example and one can freely choose an arbitrary amount of offset by inserting a proper delay. In practice, however, N/2 is a preferred choice for a digital PLL (phase lock loop) application, since in steady state the input clock CLK must be tracking the reference REF clock and therefore it is favorable to make the code group for the timing estimate be centered at zero.

Figure 4:
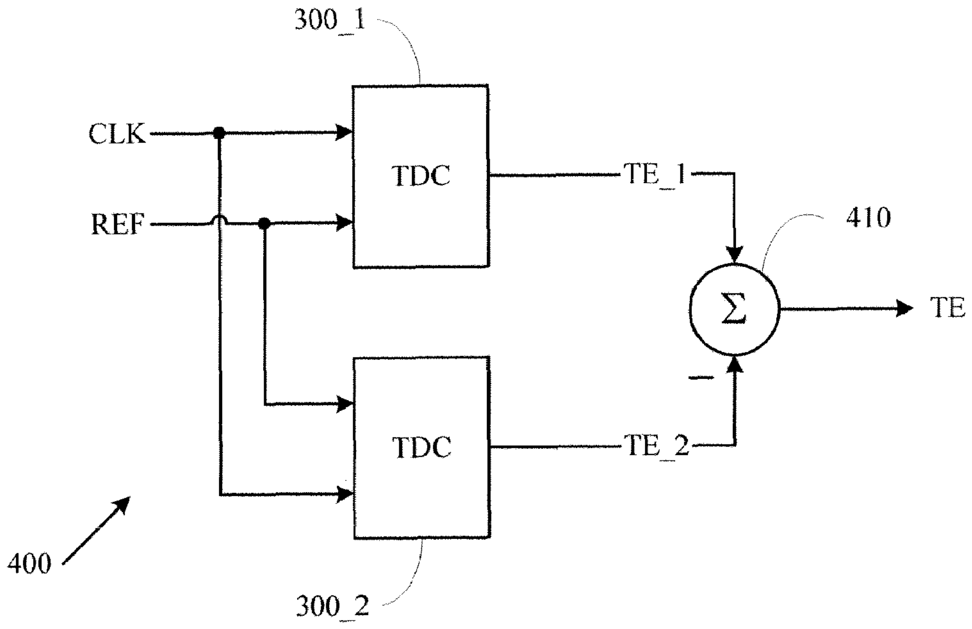
FIG. 4 depicts an alternative embodiment of a time-to-digital converter.

In a yet alternative embodiment depicted in FIG. 4, one may double the detection range by using two TDC circuits. TDC 400 of FIG. 4 comprises: a first TDC 300_1 constructed from TDC circuit 300 of FIG. 3A for detecting the timing difference between an input clock CLK and a reference clock REF and for generating a first timing estimate TE_1; a second TDC 300_2 also constructed from TDC circuit 300 of FIG. 3A for detecting the timing difference between the reference clock REF and the input clock (by swapping the role of the input clock CLK with the role of reference clock REF) and for generating a second timing estimate TE_2; and a summing circuit 410 for subtracting TE_2 from TE_1, resulting in a final timing estimate TE. Let the code group for TE_1 be $\{0, 1, 2, \ldots, N_1\}$, and the code group for TE_2 be $\{0, 1, 2, \ldots, N_2\}$. The range of timing difference between the input clock CLK and the reference clock REF that TDC 500 can detect is from $-N_2\cdot\Delta$ to $N_1\cdot\Delta$.

Extended Range TDC

Figure 5:
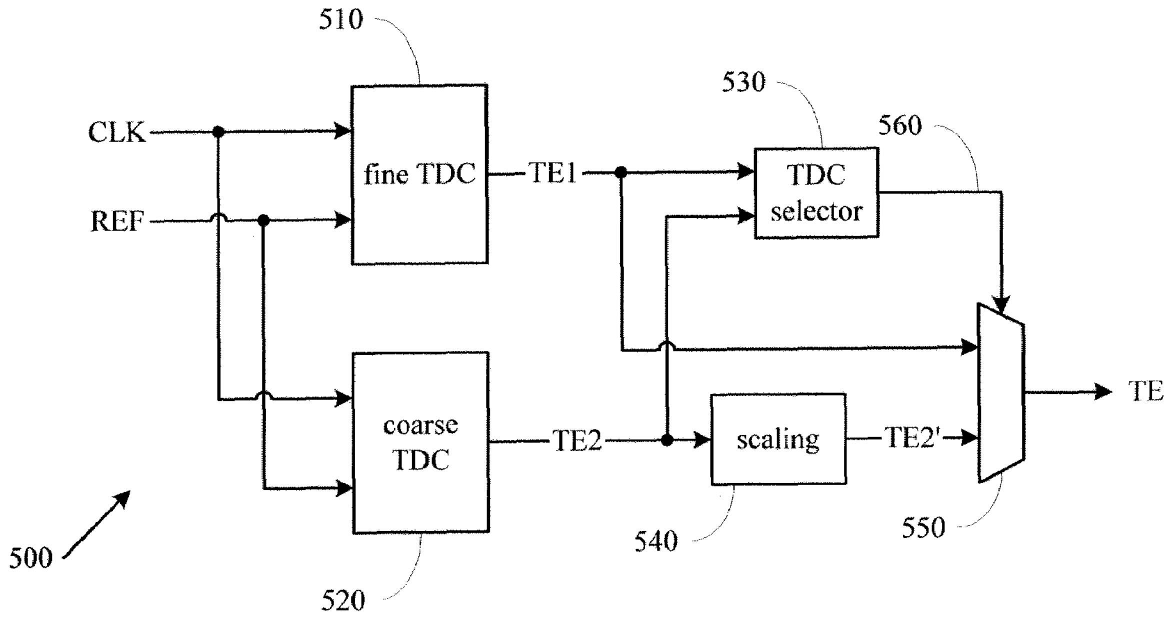
FIG. 5 depicts an extended-range time-to-digital converter.

The embodiment of TDC 300 of FIG. 3 provides a very fine timing resolution. However, the total range of timing it can detect is quite limited. For instance, if there are 8 parallel delay cells and the common difference between successive delay cells is 1 ps, the range of timing it can detect is only 8 ps. For many applications, however, a high resolution is needed only when the timing difference between CLK and REF is small while a low resolution is acceptable when the timing difference is large. For such applications, one can combine the present invention with a prior art TDC to extend the range of detection. FIG. 5 depicts a TDC 500 comprising a fine TDC 510, a coarse TDC 520, a TDC selector 530, a scaling element 540, and a multiplexer 550. The fine TDC 510 receives an input clock CLK and a reference clock CLK and generates a first timing estimate TE1 using a high-resolution but narrow-range TDC in accordance with the present invention (for example, circuit 300 of FIG. 3 or circuit 400 of FIG. 4). The coarse TDC 520 receives the input clock CLK and the reference clock REF and generating a second timing estimate TE2 using a low-resolution but wide-range TDC (for example, circuit 100 of FIG. 1). TDC selector 530 receives TE1 and TE2 and determines accordingly which timing estimate should be used. The scaling element 540 generates a scaled timing estimate TE2' by scaling the timing estimate TE2 from the coarse TDC 520 by a factor of d/Δ, where d is the resolution of the coarse TDC 520 and Δ is the resolution of the fine TDC 510. Multiplexer 550 chooses between TE1 and TE2' to generate the final timing estimate TE according to a control signal 560 from TDC selector 530. The first timing estimate TE1 is properly offset (by adjusting the delay amount of delay cell 310_0 when the fine TDC 510 is implemented by circuit 300 of FIG. 3) so that the code group for TE1 is centered near zero and TE1 is zero or virtually zero when CLK is aligned with REF. The second timing estimate TE2 is also properly offset (for example, by inserting a plurality of delay cells between REF and the flip-flops, as mentioned earlier, when the coarse TDC 520 is implemented by circuit 100 of FIG. 1) so that the code group for TE2 is centered near zero and TE2 is zero or virtually zero when CLK is aligned with REF. In a preferred embodiment, the detection range of the fine TDC 510 is equal to or comparable to the resolution of the coarse TDC 520.

In a first embodiment, the first timing estimate TE1 from the fine TDC 510 is selected by the multiplexer 550 for the final output TE unless TE1 reaches either a ceiling or a floor. For example, if 8 parallel delay cells are used in TDC 510 and the range of TE1 is between −4 and 4, inclusively, then "4" is the ceiling and "−4" is the floor for TE1. When TE1 reaches either the ceiling or the floor, the fine TDC 510 is being "saturated" and thus the coarse TDC 520 needs to be used to extend the range of detection. In a second embodiment, the second timing estimate TE2 from the coarse TDC 520 is used unless TE2 is zero or virtually zero (when there is no true zero in the code group for TE2). When TE2 is zero or virtually zero, the timing difference between CLK and REF is too small for coarse TDC 520 to resolve effectively and thus we need to use the fine TDC 510.

In an alternative embodiment not shown in the figure but is obvious to those of ordinary skills in the art, one scales TE1 (instead of TE2) by a factor of Δ/d to generate an alternative scaled timing estimate TE1' and chooses between TE1' and TE2 for the final output TE.

Figure 1:
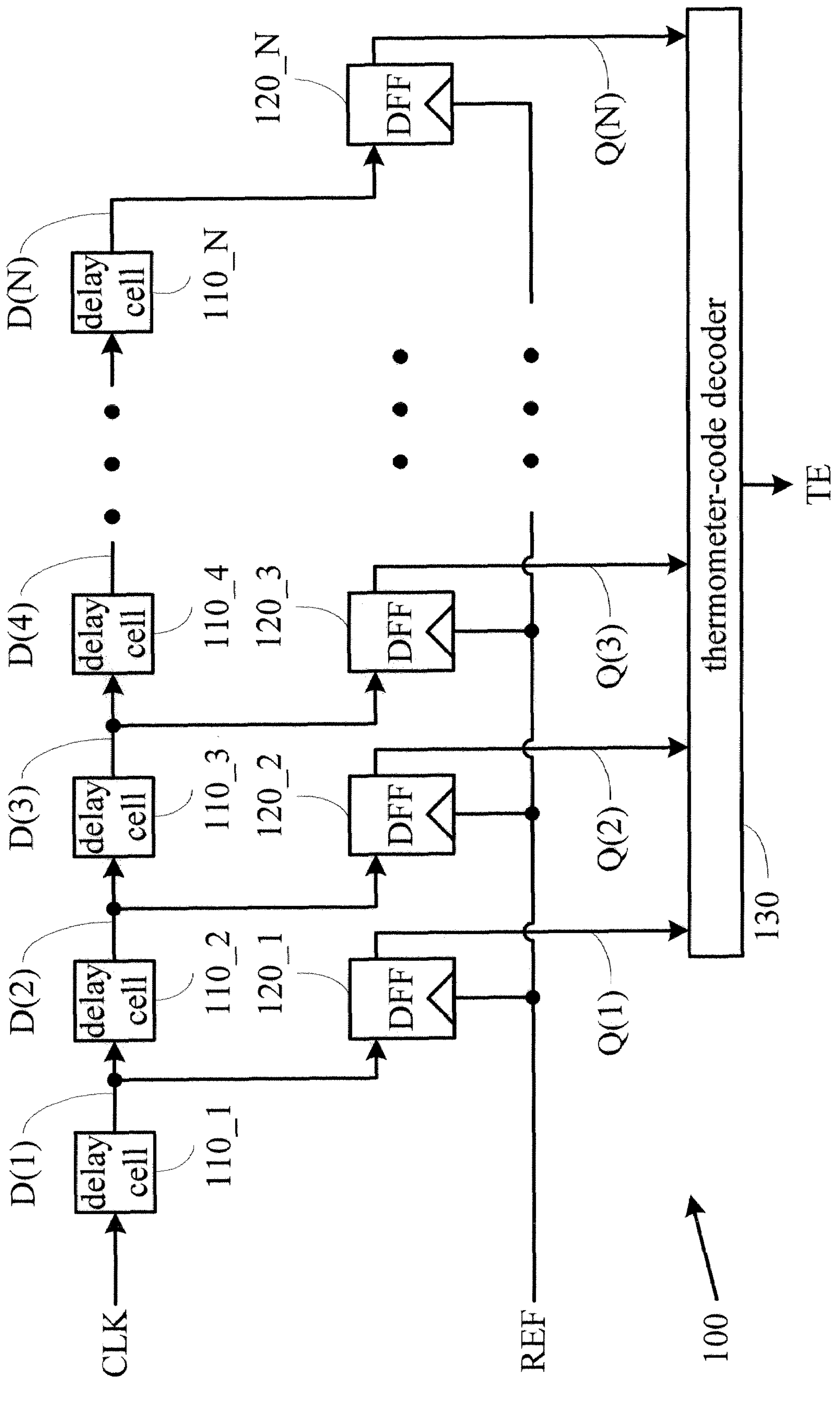
FIG. 1 (PRIOR ART)
FIG. 1 depicts a prior art time-to-digital converter.
Figure 2:
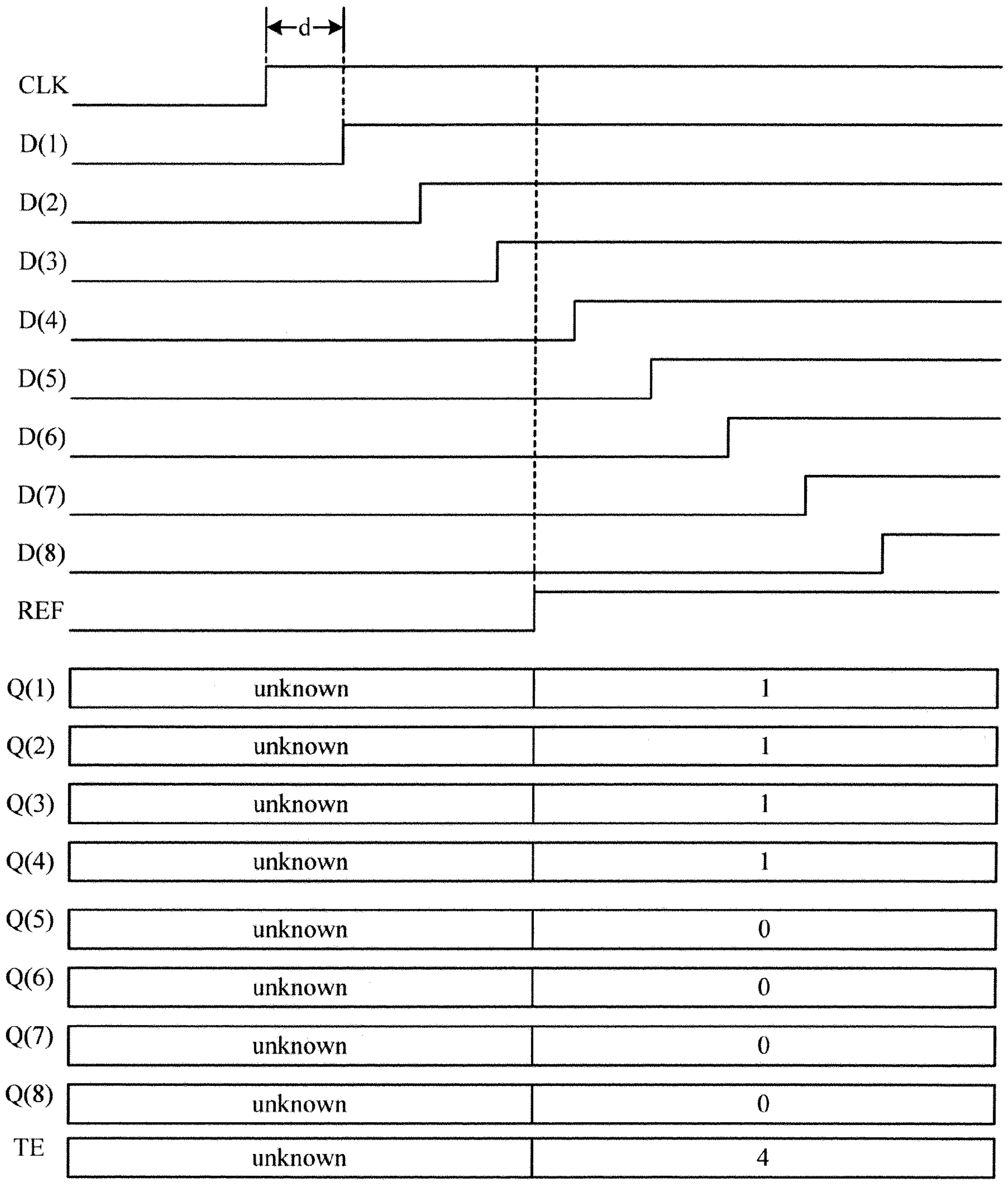
FIG. 2 (PRIOR ART)
FIG. 2 depicts an exemplary timing diagram for a prior art time-to-digital converter of FIG. 1 with 8 delay cells.

The coarse TDC 520 constructed from circuit 100 of FIG. 1 is only an exemplary embodiment. Any TDC that offers a coarse digital representation of the timing difference between an input clock CLK and a reference clock REF can be used, as long as the digital output TE2 from the coarse TDC 520 is properly offset so that its output code group is centered near zero and the digital output TE2 is zero (or virtually zero if there is no true "0" code) when CLK is aligned with REF in timing.

Digital PLL

Figure 6:
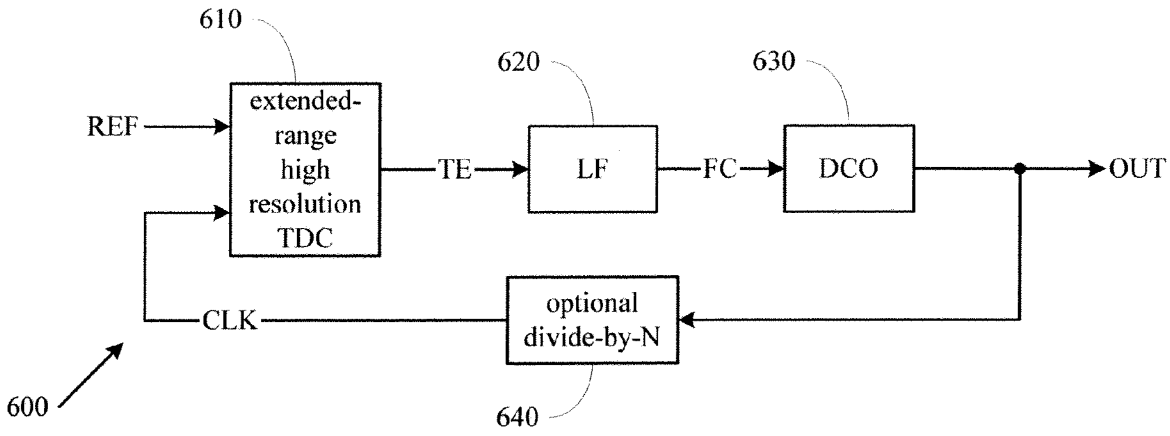
FIG. 6 depicts a digital PLL using an extended range time-to-digital converter of FIG. 5.

The present invention is particularly suitable for a digital PLL application. FIG. 6 depicts a digital PLL 600 receiving a reference clock REF and generating an output clock OUT, the digital PLL comprising: an extended-range high-resolution TDC 610 for receiving the reference clock CLK and a feedback clock CLK and for generating a timing estimate signal TE; a loop filter (LF) 620 for receiving the timing estimate signal TE and for generating a frequency control signal FC; a DCO (digitally controlled oscillator) 630 for receiving the frequency control signal FC and for generating the output clock OUT; and an optional divide-by-N circuit 640 for receiving the output clock OUT and for generating the feedback clock CLK. The extended-range high-resolution TDC 610, which is embodied for example using circuit 500 of FIG. 5, detects a timing difference between the reference clock REF and the feedback clock CLK and generates the timing estimate signal TE to represent the timing difference; the detection covers a wide range of timing difference and has a high resolution when the timing difference is small. LF 620 is a digital filter comprising at least a flip-flop and a summing element for converting the timing estimate signal TE into the frequency control signal FC. DCO 630 generates the output clock CLK, whose frequency is determined by the frequency control signal FC. The optional divide-by-N circuit 640 divides down the output clock CLK by a factor of N to generate the feedback clock CLK. The embodiments of LF 620, DCO 630, and divide-by-N circuit 640 are well known in prior art and thus not described in detail here.

Throughout this disclosure, a data flip-flop (DFF) is used as an example for sampling a first clock at an edge of a second clock. Note that data flip-flop is just an example of a "sampling" circuit. For those of ordinary skill of arts, alternative sampling circuits, for example a latch, can be used without departing from the principle of the present invention.

Throughout this disclosure, a delay cell is used to generate a delayed clock from an input clock. For those of ordinary skill of arts, any arrangement that causes a delay to a clock can be used without departing from the principle of the present invention. For example, one can use a wire to delay a clock without using an explicit delay cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A time-to-digital converter comprising:

a plurality of parallel circuits for receiving a common first clock and for generating a plurality of delayed clocks, wherein the delayed clocks have varying amounts of delay, wherein the timings of said delayed clocks form a sequence approximating an arithmetic sequence;

a plurality of sampling circuits for sampling said delayed clocks according to a second clock to generate a plurality of decisions, respectively; and a thermometer code decoder for receiving said decisions and for generating a digital output accordingly.

2. The converter of claim 1, wherein the digital output is a sum of said decisions.

3. The converter of claim 1, wherein the digital output is a sum of said decisions plus a fixed offset.

4. A method of time-to-digital conversion, the method comprising:

receiving a common first clock and generating accordingly a plurality of delayed clocks using a plurality of parallel circuits, wherein said delayed clocks have varying amounts of delay, wherein the timings of said delayed clocks form a sequence approximating an arithmetic sequence;

generating a plurality of decisions by sampling said delayed clocks at an edge of a second clock; and decoding said decisions into a digital output;

wherein the decoding further comprises using a thermometer decoder.

5. The method of claim 4, wherein the decoding further comprises summing said decisions.

6. The method of claim 4, wherein the decoding further comprising summing said decisions and a fixed offset.

7. A method of time-to-digital conversion, the method comprising:

receiving a common first clock;

generating a first group of delayed clocks from the common first clock using a plurality of parallel circuits;

generating a first group of decisions by sampling the first group of delayed clocks according to a second clock;

decoding the first group of decisions into a first timing estimate signal;

generating a second group of delayed clocks from the common first clock, wherein the delay time of the second group of delayed clocks and that of the first group of delayed clocks are different;

generating a second group of decisions by sampling the second group of delayed clocks at an edge of a third clock;

decoding the second group of decisions into a second timing estimate signal; and generating a final timing estimate signal according to the first timing estimate signal and the second timing estimate signal.

8. The method of claim 7, wherein the timings of the first delay group of delayed clocks form a sequence approximating an arithmetic sequence.

9. The method of claim 8, wherein the decoding of the first group of decisions further comprises using a first thermometer code decoder.

10. The method of claim 7, wherein the timings of the second delay group of delayed clocks form a sequence approximating an arithmetic sequence.

11. The method of claim of 10, wherein the decoding of the second group of decisions further comprises using a second thermometer-code decoder.

12. The method of claim 7, wherein the selecting further comprises: detecting a saturation condition for the first timing estimate.

13. The method of claim 12, wherein the selecting further comprises: choosing the first timing estimate signal as the final timing estimate signal unless the saturation condition is detected.

14. The method of claim 7, wherein the selecting further comprises: detecting a zero condition for the second timing estimate.

15. The method of claim 14, wherein the selecting further comprises: choosing the second timing estimate as the final timing estimate signal unless the zero condition is detected.

16. A digital clock generator comprising:

a time-to-digital converter (TDC) module comprising a first TDC comprising:

a plurality of parallel circuits for generating a first group of delayed clocks according to a first clock;

a first group of sampling circuits to generate a first group of decisions according to a second clock and the first group of delayed clocks, and a first circuit for generating a first tentative timing estimate signal according to the first group of decisions.;

a loop filter for receiving the first timing estimate signal and for generating a frequency control signal; and a DCO (digitally controlled oscillator) for receiving the frequency control signal and for generating an output clock.

17. The clock generator of claim 16, wherein said parallel circuits have varying amounts of delay and the amounts of delay form a sequence approximating an arithmetic sequence.

18. The clock generator of claim 16, wherein: the first group of delayed clocks are obtained by delaying the first clock using said parallel circuits; and the first group of decisions are obtained by sampling the first group of the delayed clocks at an edge of a third clock derived from the second clock.

19. The clock generator of claim 16, wherein: the first group of delayed clocks are obtained by delaying the second clock using said parallel circuits; and the first group of decisions are obtained by sampling the first group of the delayed clocks at an edge of a third clock derived from the first clock.

20. The clock generator of claim 16, wherein the TDC module further comprises: a second TDC for receiving the first clock and the second clock and for generating a second timing estimate signal indicative of a timing difference between the first clock and the second clock.

21. The clock generator of claim 20, wherein the TDC further comprises a multiplexing circuit to select one of the first tentative timing estimate signal and the second tentative timing estimate signal as the timing estimate signal.

22. The PLL of claim 21, wherein the first tentative timing estimate signal is selected unless the first tentative timing estimate is saturated.

23. The PLL of claim 21, wherein the second tentative timing estimate signal is selected unless the second tentative timing estimate is nearly zero.

24. A method of performing timing detection, the method comprises:

using a plurality of parallel circuits to generate a plurality of derived clocks from a common first clock;

determining a plurality of relative timing relationships between said derived clocks and a second clock; and determining a timing difference between the first clock and the second clock based on said relative timing relationships;

wherein the resolution of the timing detection is less than 20 ps.

25. The method of claim 24, wherein said derived clocks have different timings.

26. The method of claim 24, wherein the timings of said derived clocks form a sequence approximating an arithmetic sequence.

27. The method of claim 24, wherein the relative timing relationships are obtained by sampling the derived clocks using the second clock.

28. The method of claim 24, wherein the determining comprises using a decoder to convert said relative timing relationships into the timing difference.

29. A method of time-to-digital conversion, the method comprising:

receiving a first clock and generating accordingly a first group of delayed clocks using a first group of parallel circuits;

generating a first group of decisions by sampling the first group of delayed clocks according to a second clock;

decoding the first group of decisions into a first tentative timing estimate;

receiving the second clock and generating accordingly a second group of delayed clocks using a second group of parallel circuits;

generating a second group of decisions by sampling the second group of delayed clocks according to the first clock; and decoding the second group of decisions into a second tentative timing estimate; and generating a final timing estimate according to the first tentative timing estimate and the second timing estimate.

30. The method of claim 29, wherein the timings of the first group of delay clocks form a first sequence approximating an arithmetic sequence.

31. The method of claim 30, wherein the first tentative timing estimate is a sum of the first group of decisions.

32. The method of claim 29, wherein the timings of the second group of delay clocks form a second sequence approximating an arithmetic sequence.

33. The method of claim 32, wherein the second tentative timing estimate is a sum of the second group of decisions.

34. The method of claim 29, wherein the final timing estimate is a difference between the first tentative timing estimate and the second tentative timing estimate.

35. A time-to-digital converter comprising:

a plurality of parallel circuits for receiving a common first clock and for generating a plurality of delayed clocks, wherein the delayed clocks have varying amounts of delay, wherein the timings of said delayed clocks form a sequence approximating an arithmetic sequence;

a plurality of sampling circuits for sampling said delayed clocks according to a second clock to generate a plurality of decisions, respectively; and a decoder for receiving said decisions and for generating a digital output accordingly;

wherein the digital output is a sum of said decisions plus a fixed offset.

36. A method of time-to-digital conversion, the method comprising:

receiving a common first clock and generating accordingly a plurality of delayed clocks using a plurality of parallel circuits, wherein said delayed clocks have varying amounts of delay, wherein the timings of said delayed clocks form a sequence approximating an arithmetic sequence;

generating a plurality of decisions by sampling said delayed clocks at an edge of a second clock; and decoding said decisions into a digital output;

wherein the decoding further comprising summing said decisions and a fixed offset.

* * * * *